US008053882B2

(12) United States Patent  
Choi

(10) Patent No.: US 8,053,882 B2
(45) Date of Patent: Nov. 8, 2011

(54) STACKED SEMICONDUCTOR DEVICES AND SIGNAL DISTRIBUTION METHODS THEREOF

(75) Inventor: Young-Don Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/801,012

(22) Filed: May 17, 2010

(65) Prior Publication Data

US 2010/0225364 A1    Sep. 9, 2010

Related U.S. Application Data

(63) Continuation of application No. 12/216,528, filed on Jul. 7, 2008, now Pat. No. 7,737,540.

(30) Foreign Application Priority Data

Jul. 16, 2007  (KR) ........................ 10-2007-0071027

(51) Int. Cl.
   *H01L 23/52*    (2006.01)
(52) U.S. Cl. ................. 257/686; 257/777; 257/E23.173
(58) Field of Classification Search .................. 257/686, 257/777, E23.01, 723, 664, E23.173; 361/803; 327/109

See application file for complete search history.

(56) References Cited

U.S. PATENT DOCUMENTS

| 5,760,478 | A  | 6/1998  | Bozso et al. |
| 6,483,364 | B2 | 11/2002 | Choi et al. |
| 7,330,368 | B2 | 2/2008  | Saito et al. |
| 2006/0092752 | A1 | 5/2006 | Seki et al. |

FOREIGN PATENT DOCUMENTS

| JP | 10-107065   | 4/1998  |
| JP | 2006-128339 | 5/2006  |
| KR | 10-0267430  | 7/2000  |
| KR | 10-0366629  | 12/2002 |

OTHER PUBLICATIONS

Abstract of KR 1020020022423 published Mar. 27, 2002.

*Primary Examiner* — Roy K Potter
(74) *Attorney, Agent, or Firm* — Harness, Dickey & Pierce, P.L.C.

(57) ABSTRACT

A stacked semiconductor device includes a plurality of stacked chips, each having a plurality of elements to receive a signal. At least one first ladder main signal line for receiving the signal is arranged to pass through the chips. At least one second ladder main signal line is arranged to pass through the chips. A plurality of ladder buffers buffer the signal applied from the first ladder main signal line to the second ladder main signal line. The signal is uniformly distributed to the stacked chips using a ladder type circuit network technique.

20 Claims, 5 Drawing Sheets

STACKED SEMICONDUCTOR DEVICES AND SIGNAL DISTRIBUTION METHODS THEREOF

PRIORITY STATEMENT

This application is a continuation of application Ser. No. 12/216,528, filed on Jul. 7, 2008 now U.S. Pat. No. 7,737,540, which claims priority under 35 U.S.C. §119 to Korean Patent Application No. 2007-0071027, filed on Jul. 16, 2007, the entire contents of each of which are incorporated herein by reference.

BACKGROUND

A conventional semiconductor device may use many signals. The signals used in the semiconductor device may be externally applied or internally generated. Additionally, signals may be used in a region of the semiconductor device or distributed and used throughout the semiconductor device.

For example, a clock signal is a signal that may be distributed and used throughout the semiconductor device. The clock signal may be applied to various circuits implemented inside the semiconductor device. The circuits to which the clock signal is applied, may operate in synchronization with the clock signal such that the semiconductor device is operable at a proper rate in response to the clock signal. The semiconductor device or the circuits inside the semiconductor device and the external device may mutually input and output various signals at proper timings. Accordingly, the clock signal may be used as a timing reference signal for adjusting an operating rate or an input/output timing of the semiconductor device.

Since the clock signal may be used as the timing reference signal, an ideal clock signal may have the same slew rate and the same duty rate throughout the semiconductor device. Furthermore any skew or delay time difference may be eliminated. However, various signals, including the clock signal, may be transmitted through transmission lines such as metal lines and the like in the semiconductor device. In such a transmission process, the same signal may not be applied throughout the semiconductor device at the same timing because the signal may be delayed or distorted. When the clock signal is not uniformly applied throughout the semiconductor device, a timing margin of the semiconductor device may be reduced. The reduced timing margin may lead to an abnormal operation. Since the timing margin is important, equal distribution of the clock signal throughout the semiconductor device may be considered when designing the semiconductor device.

FIG. 1 illustrates an example of a single chip package (SCP) semiconductor device in which transmission lines may be arranged in an H-tree circuit network technique. In FIG. 1, the transmission lines may be arranged such that an externally applied clock signal may be uniformly distributed throughout the semiconductor device.

The SCP semiconductor device may have a single chip 10 within a package. A clock signal CLK may be uniformly distributed in all regions on the single chip 10. A transmission line (HL) arrangement illustrated in FIG. 1 is based on a signal distribution method known as an H-tree circuit network technique.

In the H-tree circuit network technique, a reference transmission line ML is arranged such that the clock signal CLK may be applied to a middle position of the chip 10. A first H transmission line HL1, may be coupled to the reference transmission line ML and transmit the clock signal CLK to the middle position of each of four regions into which the chip 10 is uniformly divided. First H transmission line HL1 may serve as a highest layer transmission line. For example, the reference transmission line ML may be coupled to the H transmission line HL1 and a center of H transmission line HL1. The H transmission line HL1 may have four end points. Each of the four end points of the H transmission line HL1 may be coupled to a corresponding middle position of each of the four regions of the chip 10.

Second H transmission lines HL2 may serve as lower layer transmission lines than the first H transmission line HL1. The middle of each second H transmission line HL2 may be coupled to a corresponding end of the first H transmission line HL1. For example, the middle of H transmission line HL2 may be coupled to the corresponding end of first H transmission line HL1. The second H transmission line HL2 may transmit the clock signal CLK to a middle position of each of four sub-divided regions of each of the four regions of the chip 10. A region where the clock signal CLK may be distributed in the chip 10 may be further sub-divided by third H transmission lines HL3 and fourth H transmission lines HL4 serving as lower layer transmission lines. For example, H transmission lines HL1, HL2, HL3 and HL4 may serve as first, second, third and fourth layer H transmission lines, respectively.

An input buffer 20 may accurately detect a signal level of the externally applied clock signal CLK, and may drive the clock signal CLK such that the clock signal CLK is accurately transmitted to the last H transmission line HL4 of the H-tree. The input buffer 20 may include a first buffer bf and a driving buffer drvbf. The first buffer bf may receive the externally applied clock signal CLK, and may detect the level of the clock signal CLK. The driving buffer drvbf may have high drive capability and may increase a swing width of the clock signal CLK output from the first buffer bf.

In FIG. 1, the fourth H transmission lines HL4, or the lowest layer should there be more than four layers of H transmission lines, may be coupled to various elements 11 implemented on the chip 10. Since the clock signals CLK applied to the elements 11 may be applied via the H transmission lines HL1-HL4, the signals may be applied via similar paths. Consequently, the clock signal CLK may be applied to each element 11 at the same timing and in the same phase throughout the chip 10.

In FIG. 1, H transmission line layers may include four layers, the first, second, third and fourth H transmission lines HL1, HL2, HL3 and HL4. However, it should be noted that the number of H transmission line layers may be decreased or increased.

FIG. 2 is a diagram illustrating a method for distributing a signal throughout a semiconductor device using a ladder type circuit network technique in the SCP semiconductor device.

The ladder type circuit network technique is a device using a phase interpolation that is disclosed in Korean Patent No. 10-0366629 (Yeong-don CHOI et al.) published on Dec. 17, 2002, the entire contents of which are incorporated herein by reference. In phase interpolation, a plurality of signals that has a small phase difference and is coupled via transmission lines may be combined to obtain one signal. For the sake of brevity, a more detailed description will be not be provided.

The ladder type circuit network technique shown in FIG. 2 may include an input buffer 21, two or more ladder transmission lines LL1 and LL2 extending side-by-side and a plurality of buffers b11-b2n. The buffers b11-b1n may be coupled in parallel between the adjacent ladder transmission lines LL1 and LL2. The input buffer 21 may operate in a similar or substantially similar manner as the input buffer 20. Thus, for the sake of brevity, the input buffer 21 will not be discussed in further detail. The plurality of buffers b11-b2n may have the same signal delay time.

A clock signal CLK applied to the first ladder transmission line LL1 through the input buffer 21 may be transmitted to the second ladder transmission line LL2 through the buffers b11-b1n provided between the first ladder transmission line LL1 and the second ladder transmission line LL2. The buffers b11-b1n may have the same signal delay time as one another. Therefore, time delay differences from a plurality of clock signals CLK applied to the second ladder transmission line LL2 through the buffers b11-b1n may have delay time differences due to distances through the first and second ladder transmission lines LL1 and LL2. Hence, the delay time difference between the clock signal CLK applied to the second ladder transmission line LL2 through the buffer b11 and the clock signal CLK applied to the second ladder transmission line LL2 through the buffer b1n may be small. Thus, the plurality of clock signals CLK applied to the second ladder transmission line LL2 may be phase-interpolated and merged into one clock signal CLK.

While only two rows of buffers and transmission lines are shown in FIG. 2, it should be understood that more than two rows may be used. When the ladder type circuit network technique is applied to the SCP semiconductor device, a plurality of ladder transmission lines of all regions on the chip may be arranged on the chip side-by-side, and a plurality of buffers may be provided between the adjacent ladder transmission lines. The plurality of ladder transmission lines LL1-LL2 may be arranged in a zigzag form or a vortex form. It should be noted that lines may be arranged in any form throughout the chip such that they do not overlap.

The conventional signal distribution methods in the SCP semiconductor device have been described with reference to FIGS. 1 and 2. However, highly integrated and multi-functional semiconductor devices may be required for miniaturized and multi-functional electronic products. A multi-chip package (MCP) semiconductor device in which a plurality of chips is packaged into a single semiconductor device has been introduced. The MCP semiconductor device may be a single layer type MCP semiconductor device or a multi-layer type MCP semiconductor device. The single layer type MCP semiconductor device is a semiconductor device in which a plurality of chips may be arranged side-by-side and packaged. The multi-layer type MCP semiconductor device (e.g., a stacked semiconductor device) is a semiconductor device in which a plurality of chips may be stacked and packaged.

FIG. 3 illustrates a signal distribution path in a conventional stacked semiconductor device.

In contrast to the SCP semiconductor device and the single layer type MCP semiconductor device, the stacked semiconductor device may have a three dimensional structure including a plurality of stacked chips Cp1-Cp5, as shown in FIG. 3. Similar to the SCP semiconductor device and the MCP semiconductor device, a clock signal may be distributed throughout the semiconductor device.

The stacked semiconductor device shown in FIG. 3 has the plurality of stacked chips Cp1-Cp5 oriented in a stacked vertical fashion. A main signal line MLM may pass through the plurality of stacked chips Cp1-Cp5, so that a signal is distributed to each of the plurality of stacked chips Cp1-Cp5. A host chip Host, serving as an internal or external device of the stacked semiconductor device, may have a reference transmission line ML and an input buffer 120. Additionally, the host chip Host may supply a clock signal CLK to the stacked semiconductor device. The input buffer 120 may be similar to the input buffers 20 and 21 of FIGS. 1 and 2, respectively. The input buffer 120 may drive and output the clock signal CLK such that the clock signal CLK is smoothly distributed to the plurality of chips Cp1-Cp5. An example in which the host chip Host is additionally provided is illustrated in FIG. 3. However, it should be understood that the host chip Host may not need to be additionally provided when one of the plurality of stacked chips Cp1-Cp5 is configured to have the reference transmission line ML and the input buffer 120 in order to receive an external clock signal CLK.

The plurality of chips Cp1-Cp5 may uniformly transmit the clock signal CLK to all regions on the plurality of stacked chips Cp1-Cp5 using the H-tree circuit network technique or the ladder type circuit network technique. As shown in FIG. 3, the main signal line MLM is arranged in a node NodeA such that the clock signal CLK can be transmitted from the middle of the plurality of chips Cp1-Cp5 as in FIG. 1.

The plurality of stacked chips Cp1-Cp5 may be the same as one another or may be different from one another. When the plurality of stacked chips Cp1-Cp5 is the same as one another, a timing margin for transmitting an inter-chip signal or a signal level may be easily set since chip characteristics may be similar. However, when the plurality of stacked chips Cp1-Cp5 of the stacked semiconductor device is different from one another, it is relatively difficult to set a timing margin for transmitting an inter-chip signal or a signal level since characteristics may differ according to a difference in a chip structure, a manufacturing process, or the like.

In order to distribute a signal throughout the semiconductor device in the above-described stacked semiconductor device, it is important to uniformly distribute the clock signal CLK to the plurality of stacked chips Cp1-Cp5. If the clock signal CLK to be applied to the plurality of stacked chips Cp1-Cp5 is not uniformly distributed, the clock signal CLK may be different among the plurality of stacked chips Cp1-Cp5 even when the clock signal CLK is uniformly distributed from the chips Cp1-Cp5.

However, as shown in FIG. 3, the conventional stacked semiconductor device is configured to smoothly distribute a signal using the H-tree circuit network technique or the ladder type circuit network technique for an internal signal distribution of each of the plurality of stacked chips Cp1-Cp5. The conventional stacked semiconductor device may use a simple signal transmission technique through the main signal line MLM for a signal distribution to the plurality of stacked chips Cp1-Cp5. However, when one of the plurality of stacked chips Cp1-Cp5 is far away from the host chip Host, the far away chip has a larger delay than another of the plurality of stacked chips Cp1-Cp5 that is closer to the host chip Host. Therefore, there is a high possibility that the applied clock signal may be distorted. That is, the signal applied to the plurality of stacked chips Cp1-Cp5 may be skewed.

SUMMARY

Example embodiments provide stacked semiconductor devices which may reduce the skew of a signal commonly applied to a plurality of stacked chips.

Example embodiments also provide signal distribution methods which may reduce the skew of a signal commonly applied to a plurality of stacked chips.

At least one example embodiment provides a stacked semiconductor device including a plurality of stacked chips wherein each chip may have a plurality of elements configured to receive a signal and perform an operation. At least one first ladder main signal line may be arranged to pass through the plurality of stacked chips and configured to receive the signal. At least one second ladder main signal line may be arranged to pass through the plurality of chips. A plurality of ladder buffers may be disposed between the at least one first ladder main signal line and the at least one second ladder main signal line on the plurality of chips. The plurality of ladder buffers may buffer the signal applied from the at least one first ladder main signal line to the at least one second ladder main signal line.

According to at least some example embodiments, each of the plurality of chips may include an H-tree circuit network having a plurality of H transmission lines hierarchically arranged to transmit the signal to at least one of the plurality of elements. The at least one second ladder main signal line may be coupled to a center of a highest layer H transmission line among a plurality of H transmission lines configuring the H-tree circuit network.

According to at least one other example embodiment, each of the plurality of chips may include a ladder circuit network having a plurality of ladder transmission lines and a plurality of buffers arranged in parallel between the plurality of ladder transmission lines to uniformly transmit the signal to at least one of the plurality of elements. The at least one second ladder main signal line may be coupled to one of the plurality of ladder transmission lines to which the signal is applied.

At least one other example embodiment provides that the plurality of chips may include a first H-tree circuit network having a higher layer H transmission line provided on a first of the plurality of chips, wherein the first H-tree circuit network may output the signal to the at least one first ladder main signal line coupled to an end of the higher layer H transmission line. At least a second of the plurality of chips may include at least one lower layer H transmission line corresponding to the higher layer H transmission line, and the at least one second ladder main signal line may be coupled to a center of the at least one lower layer H transmission line.

According to at least some example embodiments, the plurality of stacked chips may include an H-tree circuit network having at least one layer H transmission line provided on at least a first of the plurality of stacked chips to output the signal to the at least one first ladder main signal line coupled to an end of the at least one layer H transmission line. At least a second of the plurality of stacked chips may include a ladder circuit network having a plurality of ladder transmission lines and a plurality of buffers arranged in parallel between the plurality of ladder transmission lines to uniformly transmit the signal to the plurality of elements arranged on corresponding regions of the H-tree circuit network. The at least one second ladder main signal line may be coupled to at least one of the plurality of ladder transmission lines.

At least one other example embodiment provides that the plurality of chips may include a ladder circuit network having a plurality of ladder transmission lines provided on at least a first of the plurality of stacked chips and a plurality of buffers arranged in parallel between the plurality of ladder transmission lines to output the signal to the at least one first ladder main signal line. At least a second of the plurality of stacked chips may include an H-tree circuit network having a plurality of layer H transmission lines in corresponding regions of the second of the plurality of stacked chips, and the at least one second ladder main signal line may be coupled to a center of a highest layer H transmission line of the plurality of layer H transmission lines.

According to at least one other example embodiment, the plurality of stacked chips may include a primary ladder circuit network having a plurality of primary ladder transmission lines provided on at least a first of the plurality of chips and a plurality of primary buffers arranged in parallel between the plurality of primary ladder transmission lines to output the signal to the at least one first ladder main signal line. At least a second of the plurality of stacked chips may include a secondary ladder circuit network having a plurality of secondary ladder transmission lines provided in corresponding regions of the second of the plurality of stacked chips and a plurality of secondary buffers arranged in parallel between the plurality of secondary ladder transmission lines. The at least one second ladder main signal line may be coupled to at least one of the plurality of secondary ladder transmission line.

At least one other example embodiment provides a signal distribution method for a stacked semiconductor device including a plurality of stacked chips, each chip having a plurality of elements configured to receive a signal and perform an operation. The method may include receiving the signal at an at least one first ladder main signal line. The at least one first ladder main signal line may pass through the plurality of stacked chips. The method may also include buffering the signal through a plurality of ladder buffers from the first ladder main signal line to an at least one second ladder main signal line. The at least one second ladder main signal line may pass through the plurality of stacked chips.

According to at least some example embodiments, the method may include transmitting the signal uniformly to at least a first of the plurality of elements using an H-tree circuit network having a plurality of H transmission lines. Furthermore, the method may include coupling the at least one second ladder main signal line to a center of a highest layer H transmission line of the plurality of H transmission lines.

At least one other example embodiment provides transmitting the signal uniformly to at least a first of the plurality of elements using a ladder circuit network having a plurality of ladder transmission liens and a plurality of buffers arranged in parallel between the plurality of ladder transmission lines.

BRIEF DESCRIPTION OF THE DRAWINGS

Example embodiments will be more clearly understood from the following detailed description taken in conjunction with the accompanying drawings, in which.

DETAILED DESCRIPTION OF EXAMPLE EMBODIMENTS

Figure 1:
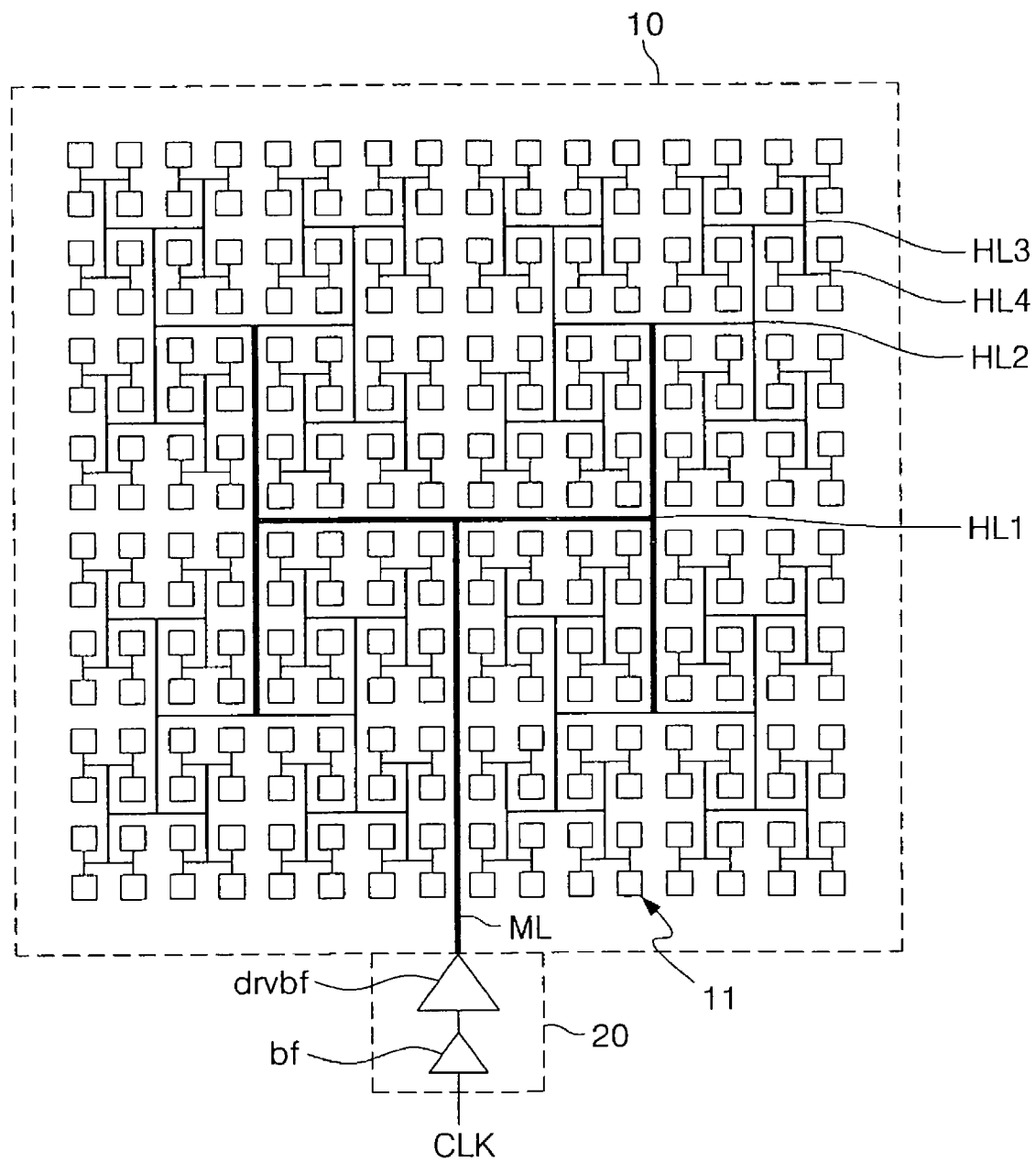
FIG. 1 illustrates a conventional single chip package semiconductor device in which transmission lines are arranged in an H-tree circuit network technique.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments of a stacked semiconductor device and a signal distribution method thereof will now be described more fully hereinafter with reference to the accompanying drawings.

Figure 4:
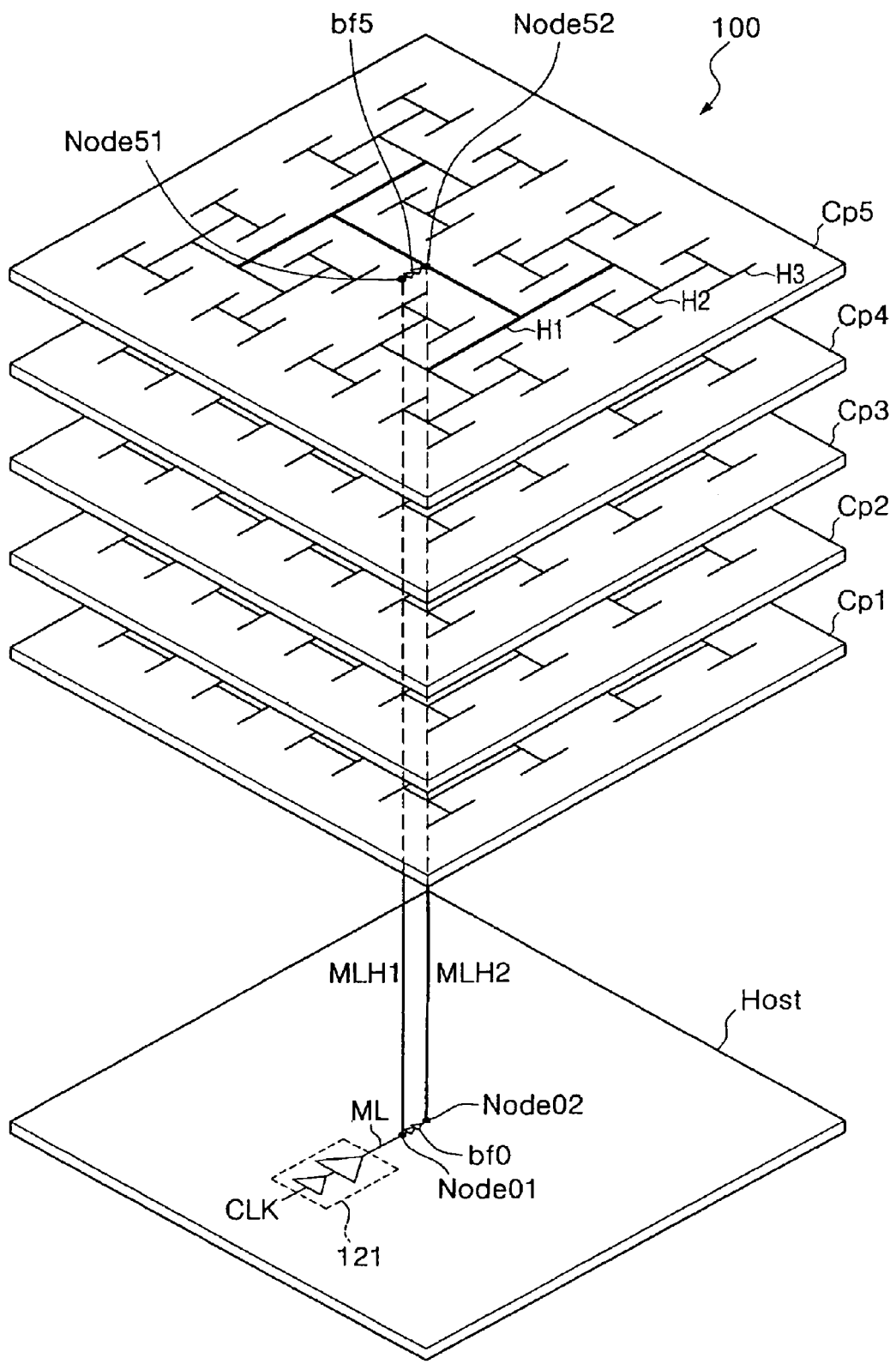
FIG. 4 illustrates a signal distribution path in a stacked semiconductor device according to an example embodiment.

FIG. 4 illustrates a signal distribution path in a stacked semiconductor 100 device according to an example embodiment. An example in which a clock signal CLK may be distributed throughout the semiconductor device 100 will now be described with reference to FIG. 4.

The stacked semiconductor device 100 shown in FIG. 4 may include a plurality of ladder main signal lines MLH1 and MLH2 for transmitting the same signal to a plurality of stacked chips Cp1-Cp5. The stacked semiconductor device 100 may use a ladder type circuit network technique. As previously described above, the ladder type circuit network technique may have two or more ladder transmission lines extending side-by-side and a plurality of buffers coupled in parallel between adjacent ladder transmission lines. Here, the plurality of buffers may have the same signal delay time.

In FIG. 4, the ladder transmission lines for uniformly transmitting the clock signal CLK to the plurality of stacked chips Cp1-Cp5 may be the first and second ladder main signal lines MLH1 and MLH2, and a plurality of buffers bf0-bf5 may be coupled between the first and second ladder main signal lines MLH1 and MLH2. In FIG. 4, only the two ladder main signal lines MLH1 and MLH2 are illustrated, but three or more ladder main signal lines may be provided. When the stacked semiconductor device 100 has three or more ladder main signal lines, a plurality of buffers may be additionally provided between adjacent ladder main signal lines.

Figure 2:
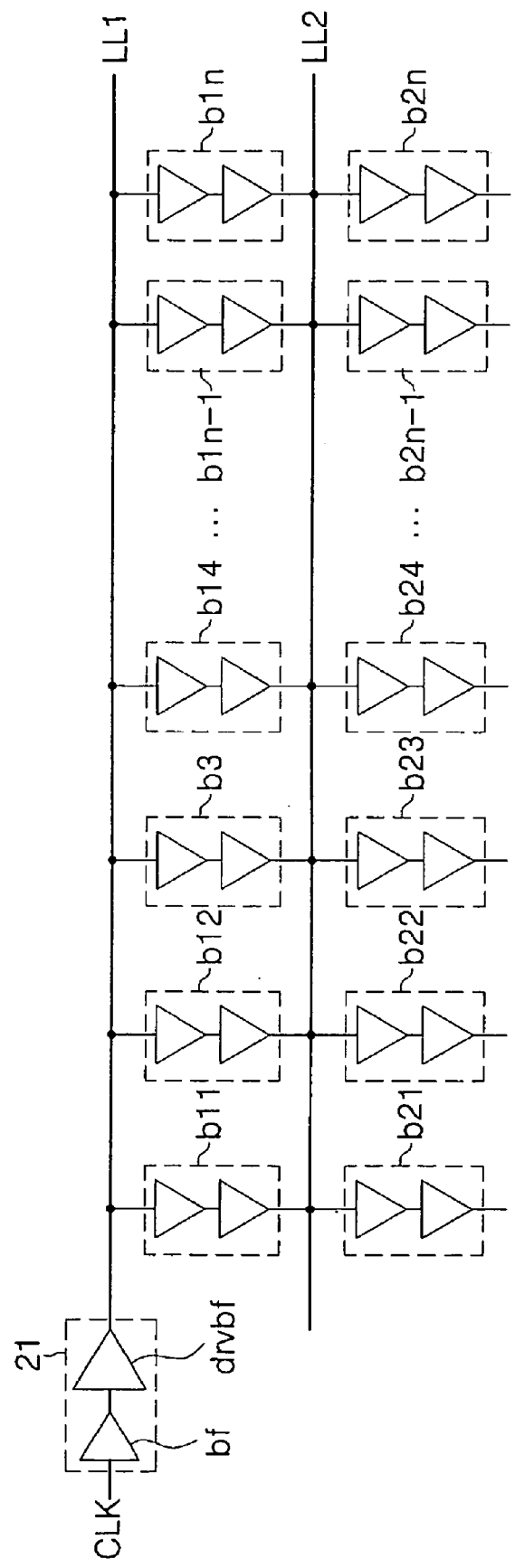
FIG. 2 illustrates a conventional single chip package semiconductor device in which transmission lines are arranged in a ladder type circuit network technique.
Figure 3:
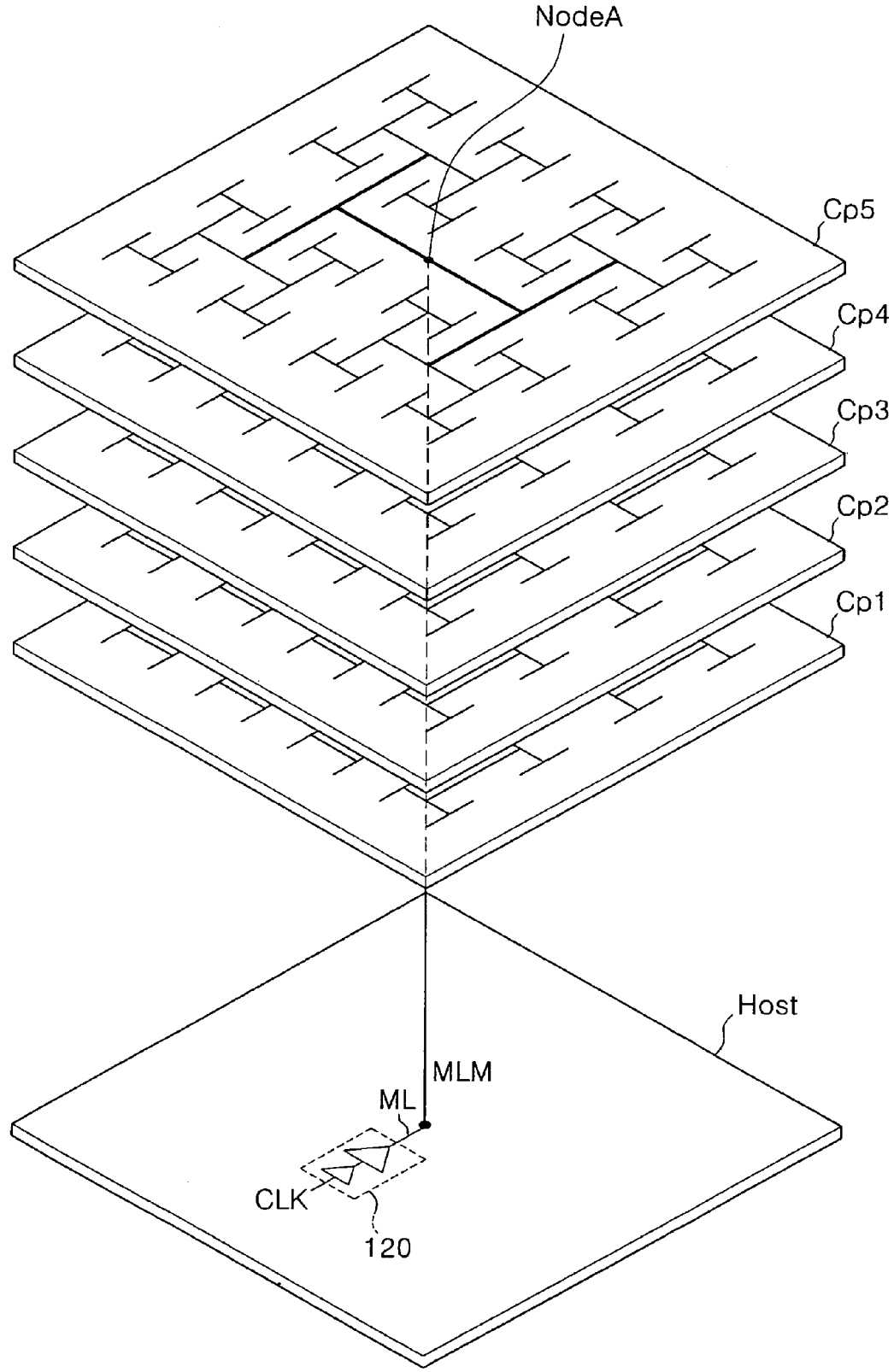
FIG. 3 illustrates a signal distribution path in a conventional stacked semiconductor device.

In contrast to FIG. 2, the ladder type circuit network technique in FIG. 4 may be applied three dimensionally to distribute a signal to each of the plurality of stacked chips Cp1-Cp5. When the ladder type circuit network technique is applied to the single chip, the arrangement of a plurality of ladder transmission lines LL1-LL2 or buffers b11-b2$n$ may be free. However, since insulators may be arranged between the plurality of stacked chips Cp1-Cp5 when the ladder type circuit network technique is applied to the ladder main signal lines MLH1 and MLH2 in the stacked semiconductor device 100, the plurality of ladder buffers bf0-bf5 may be distributed and arranged in the plurality of chips Cp1-Cp5. Each of the plurality of stacked chips Cp1-Cp5 may include a corresponding buffer bf0-bf5.

Here, the plurality of ladder buffers bf0-bf5 may be distributed and arranged in the plurality of stacked chips Cp1-Cp5 and have a small signal time delay difference. When each of the plurality of stacked chips Cp1-Cp5 is identical to the others, the plurality of distributed ladder buffers bf0-bf5 may have substantially similar characteristics.

However, when each of at least one of the plurality of stacked chips Cp1-Cp5 is different from the others, a signal time delay difference may be caused by characteristics of the plurality of ladder buffers bf0-bf5. When a plurality of clock signals CLK are not phase interpolated by a signal time delay difference of the plurality of ladder buffers bf0-bf5, multiple clock signals CLK may be generated to the second ladder main signal line MLH2 and applied to the plurality of stacked chips Cp1-Cp5, leading to an abnormal operation of the stacked semiconductor device 100. Therefore, in order to minimize the abnormal operation, the characteristics of the plurality of ladder buffers bf0-bf5 may be as similar as possible.

Nonetheless, even when a signal time delay difference within a fixed level is present among the plurality of ladder buffers bf0-bf5 or a signal time delay difference is caused by a process deviation, a temperature difference, or a voltage difference (or PVT variation), clock signals CLK may be combined to reduce the skew thereof when the phase interpolation is possible. Accordingly, the characteristics of the plurality of ladder buffers bf0-bf5 do not need to be completely identical. Since the first and second ladder main signal lines MLH1 and MLH2 extend side by side in FIG. 4, the first and second ladder main signal lines MLH1 and MLH2 may intersect at nodes Node01-Node52 corresponding to a host chip Host and the plurality of stacked chips Cp1-Cp5. For example, the first ladder main signal line MLH1 may be coupled to the node Node51 on the chip Cp5, the second ladder main signal line MLH2 may be coupled to the node Node52 on the chip Cp5 and nodes Node51 and Node52 may be coupled by buffer bf5.

The first ladder main signal line MLH1 may be coupled to the host chip Host and the plurality of stacked chips Cp1-Cp5 at the corresponding nodes Node01, Node11, - - - , Node51. The second ladder main signal line MLH2 may be arranged in parallel with the first ladder main signal line MLH1 and coupled to the host chip Host and the plurality of stacked chips Cp1-Cp5 at the corresponding nodes Node02, Node12, - - -, Node52. The plurality of ladder buffers bf0-bf5 may be arranged between the nodes Node01, Node11, - - -, Node51 and the nodes Node02, Node12, - - -, Node52, respectively, on the corresponding host chip Host and the corresponding plurality of stacked chips Cp1-Cp5.

The stacked semiconductor device 100 of FIG. 4 may have the plurality of stacked chips Cp1-Cp5 with a plurality of elements (not illustrated) for performing an operation. The plurality of stacked chips Cp1-Cp5 may use the H-tree circuit network technique or the ladder circuit network technique to smoothly distribute the clock signal CLK applied from the nodes Node12, - - -, Node52. The host chip Host may have a reference transmission line ML and an input buffer 121 serving as an internal or external device of the stacked semiconductor device and supplying the clock signal CLK to the semiconductor device. However, the host chip Host may not need to be additionally provided when one of the plurality of stacked chips Cp1-Cp5 is configured with a reference transmission line ML and an input buffer 121 to receive an external clock signal CLK.

The operation of the stacked semiconductor device 100 of the present invention will now be described with reference to FIG. 4. When the clock signal CLK is applied to the host chip Host, the input buffer 121 may detect the clock signal CLK, increase a swing width thereof, and output it to the reference transmission line ML. The clock signal CLK may be applied to the first ladder main signal line MLH1 through the reference transmission line ML. At the nodes Node01, - - -, Node51 in which the first ladder main signal line MLH1 may intersect with the corresponding plurality of stacked chips Cp1-Cp5 and the host chip Host, the clock signals CLK may be different due to the skew thereof according to a length of the first ladder main signal line MLH1. However, a plurality of clock signals CLK to be applied to the second ladder main signal line MLH2 through the plurality of ladder buffers bf0-bf5 may be phase interpolated and merged into one clock signal CLK.

At the nodes Node02, - - -, Node52 in which the second ladder main signal line MLH2 intersects with the corresponding plurality of stacked chips Cp1-Cp5 and the host chip Host, the clock signals CLK may be output as the same signal. There, the clock signals CLK applied to the plurality of stacked chips Cp1-Cp5 may be the same or substantially the same.

When the same clock signal CLK is applied to the plurality of stacked chips Cp1-Cp5, the plurality of stacked chips Cp1-Cp5 may distribute the clock signal CLK to regions on each of the plurality of chips using the H-tree circuit network technique or the ladder circuit network technique.

The clock signal CLK may be distributed from the middle of each of the stacked chips Cp1-Cp5, in an H-tree circuit network technique. Consequently, the second main signal line MLH2 may be arranged to intersect with a first H transmission line H1 at the middle of each of the plurality of stacked chips Cp1-Cp5. Furthermore, H1 may be the highest layer and higher than H transmission lines H2 and H3.

When each of the plurality of stacked chips Cp1-Cp5 uses the ladder circuit network technique, a position at which the clock signal CLK starts to be distributed to each of the plurality of stacked chips is not limited, allowing the second ladder main signal line MLH2 to be freely arranged. For example, when a ladder transmission line arrangement on the plurality of stacked chips Cp1-Cp5 using the ladder circuit network technique is considered, the second ladder main signal line MLH2 may be arranged at an edge of the plurality of chips Cp1-Cp5.

When one of the plurality of stacked chips Cp1-Cp5 is configured with the reference transmission line ML and the input buffer 121 to receive the external clock signal CLK without any host chip Host in the stacked semiconductor device, any chip of the plurality of chips Cp1-Cp5 may receive an applied clock signal CLK. For example, a lower most chip, Cp1, may receive the applied clock signal CLK.

Figure 5:
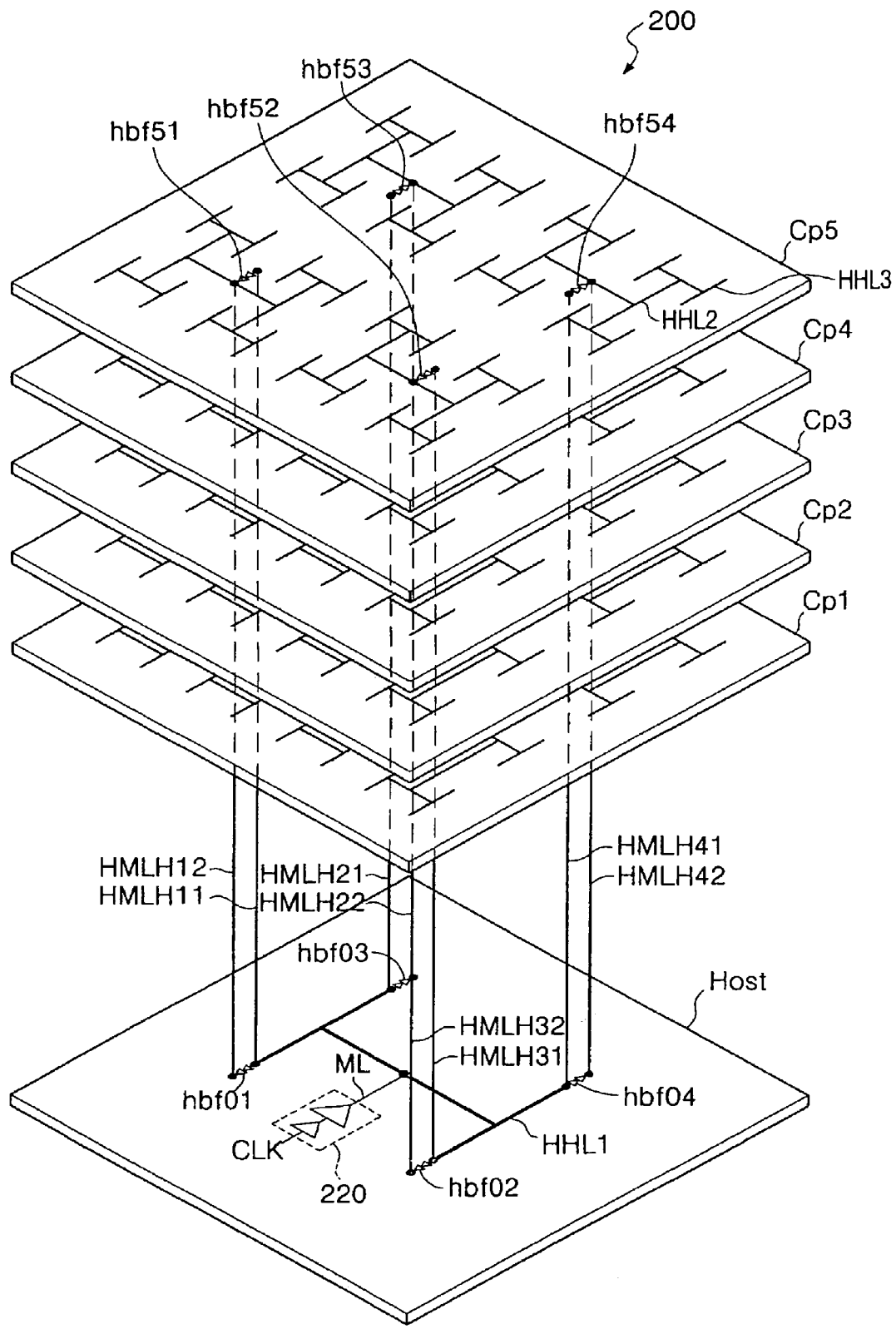
FIG. 5 illustrates a signal distribution path in a stacked semiconductor device according to another example embodiment.

FIG. 5 illustrates a signal distribution path in a stacked semiconductor device 200 according to another example embodiment.

As shown in FIG. 5, the number of ladder main signal line pairs for applying the clock signal CLK to the plurality of chips Cp1-Cp5 may be more than one. For example, the example embodiment in FIG. 5 may have ladder main signal line pairs HMLH11-HMLH12, HMLH21-HMLH22, HMLH31-HMLH32 and HMLH41-HMLH42. When an area of the plurality of chips Cp1-Cp5 is wide, the same clock signal CLK may be applied to all elements (not illustrated) on each of the plurality of stacked chips Cp1-Cp5 if the clock signal CLK is distributed using the H-tree circuit network technique in each of the plurality of stacked chips Cp1-Cp5. However, the signal may be delayed or distorted during passing through an H transmission line. That is, the same clock signal CLK is applied to all the elements of the plurality of chips Cp1-Cp5, but the clock signal may be distorted and applied.

However, as shown in FIG. 5, a signal delay and distortion may be further reduced by directly applying the clock signal CLK to second (i.e., a lower) layer H transmission lines HHL2 on each of the plurality of stacked chips Cp1-Cp5. For example, a first (i.e. a higher) layer H transmission HHL1 may be the highest H transmission line layer, located on a host chip Host and used to send signals to lower layer H transmission lines HHL2 on each of plurality of stacked chips Cp1-Cp5. Lower layer H transmission lines HHL2 may then distribute the signal to an even lower layer of corresponding H transmission lines HHL3.

The signal delay and distortion may be further reduced by dividing each of the plurality of stacked chips Cp1-Cp5 into regions and arranging corresponding ladder transmission lines to distribute the clock signal CLK to each region.

FIG. 5 illustrates the stacked semiconductor device 200 configured such that each of the plurality of stacked chips Cp1-Cp5 may be divided into regions and the same clock signal may be applied to each region.

The host chip Host of FIG. 5 may be configured to apply the same clock signal CLK to each region on each of the plurality of stacked chips Cp1-Cp5. In FIG. 5, the host chip Host may include a reference transmission line ML, an input buffer 220 for receiving the clock signal CLK and transmitting the clock signal CLK to a middle position of the host chip Host and the first H transmission line HHL1. The first H transmission line HHL1 may serve as a higher layer H transmission line for transmitting the clock signal CLK from the reference transmission line ML to a plurality of regions on the host chip Host. Each region on the host chip Host may correspond to an end of the first H transmission line HHL1. Four clock signals CLK may be applied to the corresponding ends of the first H transmission line HHL1 by the H-tree circuit network technique. The four clock signals may be substantially identical.

The configuration of the input buffer 220 may be similar to the input buffer 121 of FIG. 4, and may detect and output the clock signal CLK by increasing a swing width thereof. The clock signals CLK may be applied to the ends of the H-shaped transmission line HHL1 through the reference transmission line ML and the first H-shaped transmission line HHL1 may uniformly apply the clock signals CLK to four regions into which the host chip is uniformly divided.

At the ends of the first H-shaped transmission line HHL1, the stacked semiconductor device 200 of FIG. 5 may have multiple pairs of H ladder main signal lines HMLH11-HMLH42 intersecting with the plurality of stacked chips Cp1-Cp5.

Each of the multiple pairs of H ladder main signal lines HMLH11-HMLH42 may have at least two signal lines. The plurality of ladder buffers hbf01-hbf54 may be arranged between first H ladder main signal lines HMLH11, HMLH21, - - -, HMLH41 and second H ladder main signal lines HMLH12, HMLH22, - - -, HMLH42 may be provided on the plurality of stacked chips Cp1-Cp5 and the host chip Host.

When the clock signal CLK is applied to the first H ladder main signal lines HMLH11, HMLH21, - - -, HMLH41 through the first H transmission line HHL1, the clock signal CLK may be applied to the second H ladder main signal lines HMLH12, HMLH22, - - -, HMLH42 and the lower layer H transmission lines HHL2 through the plurality of ladder buffers hbf01-hbf54 provided on the plurality of stacked chips Cp1-Cp5. A plurality of clock signals CLK applied to the second H ladder main signal lines HMLH12, HMLH22, - - -, HMLH42 may be phase interpolated and merged into one clock signal CLK. The same clock signal CLK may be applied to regions corresponding to the second H ladder main signal lines HMLH12, HMLH22, - - -, HMLH42 on the plurality of stacked chips Cp1-Cp5. When the plurality of ladder buffers hbf01-hbf54 are similar or substantially similar, the clock signals CLK of the regions may be the same or substantially the same.

As shown in FIG. 5, the first H transmission line HHL1 may be provided in the host chip Host instead of providing a first layer H transmission line in each of the plurality of chips Cp1-Cp5. Furthermore, the clock signal CLK may be transmitted to each region of each of the plurality of chips Cp1-Cp5 through the plurality of H ladder main signal lines HMLH11-MHLH42 at the ends of the first H transmission line HHL1, such that the delay and distortion of the clock signal CLK can be reduced.

In FIG. 5, the host chip Host may have the first H transmission line HHL1 serving as the higher layer H transmission line to transmit the clock signal CLK, but of course H transmission lines of a larger number of layers may be provided in the host chip Host. It should be understood that host chip Host may have two or more H transmission line layers wherein the H ladder main signal lines are to be arranged at ends of H transmission lines of the lowest layer among the H transmission line layers on the host chip Host. When the host chip Host has only the first H transmission line HHL1, the number of H ladder main signal lines may be reduced.

The host chip Host may not need to be provided when the stacked semiconductor device 200 of FIG. 5 is configured such that one of the plurality of stacked chips Cp1-Cp5 has the reference transmission line ML, the input buffer 220, and the higher layer H transmission line HHL1 to receive an external clock signal CLK.

The plurality of stacked chips Cp1-Cp5 may use different signal distribution techniques if needed. For example, the chips Cp1-Cp3 may use the H-tree circuit network technique and the chips Cp4 and Cp5 may use the ladder type circuit network technique.

An example in which a clock signal CLK may be distributed throughout a stacked semiconductor device has been described, but other signals may be distributed in the same way. Moreover, example embodiments may be applied to a signal to be distributed between some chips of a plurality of chips Cp1-Cp5 and a signal to be distributed to a given region of the plurality of chips Cp1-Cp5.

As illustrated, a ladder main signal line and a ladder signal line may be arranged to pass through a plurality of chips, such that it is possible to design a circuit robust to a variation due to a process of each of the plurality of chips.

Accordingly, the signal may be distributed to the stacked chips using a ladder type circuit network technique irrespective of the number of chips, such that the same signal is applied to all the chips.

While example embodiments have been shown and described with reference to example embodiments shown in the figures, it will be understood to those skilled in the art that modifications and variations can be made without departing from the spirit and scope of the invention as defined by the following claims.

What is claimed is:

1. A multi-layer semiconductor device comprising:
   a first layer of the device including a first buffer having a first terminal and a second terminal;
   a second layer of the device including a second buffer having a third terminal and a fourth terminal;
   a first conductor ladder main signal line arranged to pass through the first layer and the second layer; and
   a second conductor ladder main signal line arranged to pass through the first layer and the second layer, wherein
      the first terminal of the first buffer and the third terminal of the second buffer are coupled to the first conductor ladder main signal line, and
      the second terminal of the first buffer and the fourth terminal of the second buffer are coupled to the second conductor ladder main signal line.

2. The multi-layer semiconductor device of claim 1, further comprising:
   a plurality of third conductor ladder main signal lines arranged to pass through at least the first and second layers; and
   a plurality of buffers arranged between the first conductor ladder main signal line and the third conductor ladder main signal lines, between the plurality of third conductor ladder main signal lines, and between the plurality of third conductor ladder main signal lines and the second conductor ladder main signal line.

3. The multi-layer semiconductor device of claim 1, wherein each of the at least first and second layers includes,
   a ladder circuit network having a plurality of ladder transmission lines and a plurality of buffers arranged in parallel between the plurality of ladder transmission lines to uniformly transmit a signal to at least a first of a plurality of elements,
   wherein the second conductor ladder main signal line is coupled to a first of the plurality of ladder transmission lines.

4. The multi-layer semiconductor device of claim 1, wherein the first layer includes an input buffer for receiving and a driving buffer for driving a signal to the first conductor ladder main signal line.

5. The multi-layer semiconductor device of claim 1, further comprising:
   a host layer added to the first and second layers, the host layer having an input buffer for receiving and driving a signal to the first ladder main signal line.

6. The multi-layer semiconductor device of claim 1, wherein the plurality of layers includes,
   at least the first layer having a primary ladder circuit network including a plurality of primary ladder transmission lines and a plurality of primary buffers arranged in parallel between the plurality of primary ladder transmission lines, the primary ladder circuit network configured to output a signal to the first conductor ladder main signal line; and at least the second layer having a secondary ladder circuit network including a plurality of secondary ladder transmission lines in regions of the first and second layers and a plurality of secondary buffers arranged in parallel between the plurality of secondary ladder transmission lines, wherein the second conductor ladder main signal line is coupled to at least a first of the plurality of secondary ladder transmission lines.

7. The multi-layer semiconductor device of claim 1, wherein output signals output from the first and second buffers are uniformly transmitted to the first and second layers as one signal.

8. A multi-layer semiconductor device comprising:

a plurality of layers of the device, each of the plurality of layers having a first node, a second node and a ladder buffer connected between the first node and the second node;

a first ladder main signal line arranged to pass through the first nodes of the layers; and a second ladder main signal line arranged to pass through the second nodes of the layers.

9. The multi-layer semiconductor device of claim 8, further comprising:

at least one third node disposed on each of the plurality of layers;

at least one third ladder main signal line arranged to pass through the third nodes of the plurality of layers; and a plurality of ladder buffers connected respectively between the first node and the third nodes, between the second node and the third nodes, and between the third nodes.

10. The multi-layer semiconductor device of claim 8, wherein each of the plurality of layers includes, a ladder circuit network having a plurality of ladder transmission lines and a plurality of buffers arranged in parallel between the plurality of ladder transmission lines to uniformly transmit a signal to at least a first of a plurality of elements, wherein the second ladder main signal line is coupled to a first of the plurality of ladder transmission lines.

11. The multi-layer semiconductor device of claim 8, wherein a first of the plurality of layers includes an input buffer for receiving and a driving buffer for driving a signal to the first ladder main signal line.

12. The multi-layer semiconductor device of claim 8, further comprising:

a host layer added to the plurality of layers, the host layer having an input buffer for receiving and driving a signal to the first ladder main signal line.

13. The multi-layer semiconductor device of claim 8, wherein the plurality of layers includes, at least a first of the plurality of layers having a primary ladder circuit network including a plurality of primary ladder transmission lines and a plurality of primary buffers arranged in parallel between the plurality of primary ladder transmission lines, the primary ladder circuit network configured to output a signal to the first ladder main signal line; and at least a second of the plurality of layers having a secondary ladder circuit network including a plurality of secondary ladder transmission lines in regions of the plurality of layers and a plurality of secondary buffers arranged in parallel between the plurality of secondary ladder transmission lines, wherein the second ladder main signal line is coupled to at least a first of the plurality of secondary ladder transmission lines.

14. The multi-layer semiconductor device of claim 8, wherein output signals from the plurality of ladder buffers are uniformly transmitted to the plurality of layers as one signal.

15. A signal distribution method of a multi-layer semiconductor device including a plurality of layers, each having a plurality of elements to receive a signal and perform an operation, comprising:

receiving the signal at a first ladder main signal line, the first ladder main signal line passing through the plurality of layers; and buffering the signal output from the first ladder main signal line through a plurality of ladder buffers arranged at each of the plurality of layers; and transmitting the buffered signals to a second ladder main signal line, the second ladder main signal line passing through the plurality of layers.

16. The signal distribution method of claim 15, further comprising:

transmitting the signal uniformly to at least a first of the plurality of elements using an H-tree circuit network having a plurality of H transmission lines.

17. The signal distribution method of claim 16, further comprising:

coupling the at least one second ladder main signal line to a center of at least a first of the plurality of H transmission lines.

18. The signal distribution method of claim 16, further comprising:

coupling the at least one first ladder main signal line to an end of at least a first of the plurality of H transmission lines.

19. The signal distribution method of claim 15, further comprising:

transmitting the signal uniformly to at least a first of the plurality of elements using a ladder circuit network having a plurality of ladder transmission lines and a plurality of buffers arranged in parallel between the plurality of ladder transmission lines.

20. The signal distribution method of claim 19, further comprising:

coupling the at least one second ladder main signal line to one of the plurality of ladder transmission lines.

\* \* \* \* \*